United States Patent [19]
Solie

[11] 4,191,934
[45] Mar. 4, 1980

[54] HIGH EFFICIENCY WIDE BAND SURFACE ACOUSTIC WAVE COUPLER PROCESSORS

[75] Inventor: Leland P. Solie, Acton, Mass.

[73] Assignee: Sperry Corporation, New York, N.Y.

[21] Appl. No.: 968,242

[22] Filed: Dec. 11, 1978

[51] Int. Cl.² .................. H03H 9/26; H03H 9/30; H03H 9/32; H01L 41/10
[52] U.S. Cl. .................................. 333/155; 333/156; 333/195
[58] Field of Search .................. 333/150–155, 333/193–196, 156–157; 331/107 A; 310/313; 330/5.5

[56] References Cited
U.S. PATENT DOCUMENTS

| | | |
|---|---|---|
| 3,836,876 | 9/1974 | Marshall et al. ............... 310/313 X |
| 3,947,783 | 3/1976 | Maerfeld ........................ 310/313 X |
| 4,038,614 | 7/1977 | Chapman et al. .............. 310/313 X |
| 4,079,342 | 3/1978 | Solie .................................. 333/195 |
| 4,110,653 | 8/1978 | Hartemann ........................ 310/313 |

Primary Examiner—Alfred E. Smith
Assistant Examiner—Marvin Nussbaum
Attorney, Agent, or Firm—Howard P. Terry

[57] ABSTRACT

A surface wave signal processor employs acoustic means for processing electrical input signals for yielding modified delayed output signals. The piezoelectric coupling devices of the invention propagate energy in a first acoustic wave at a surface of a first medium and electrically transfer it to a second acoustic wave propagating at a surface of a second medium in such a manner that temperature variation of the delay is minimized.

7 Claims, 4 Drawing Figures

HIGH EFFICIENCY WIDE BAND SURFACE ACOUSTIC WAVE COUPLER PROCESSORS

BACKGROUND OF THE INVENTION

1. Field of the Invention

The present invention relates generally to acoustic surface wave energy devices employing acoustical means for processing electrical input signals and yielding modified electrical output signals and, more particularly, concerns piezoelectric acoustic surface wave coupling devices in which the propagating energy is transferred from one acoustic wave propagating path or track at the surface of a first medium to a second acoustic wave propagating track at the surface of a second medium.

2. Description of the Prior Art

Prior art acoustic coupler and acoustic coupling filter devices having a pair of coupled propagation tracks have been described extensively in the literature, which includes descriptions of track changing directional coupler devices generally similar in nature to those of the L. P. Solie U.S. Pat. Nos. 3,898,592 for an "Acoustic Surface Wave Signal Processor", issued Aug. 5, 1975 and 4,079,342 for "Fanned Multistrip Coupler Filters", issued Mar. 14, 1978, both patents being assigned to Sperry Rand Corporation. Of interest also are the concepts described in the technical paper entitled: "Surface-Acoustic-Wave Multiplexing Techniques" by H. Van de Vaart and L. P. Solie, *Proceedings of th I.E.E.E.*, May 1976, Vol. 4, No. 5, pages 688 to 691.

In more particular, there are several piezoelectric substrate materials known to cooperate in the generation and propagation of surface acoustic waves along such tracks, including $LiNbO_3$, $LiTaO_3$, quartz, and the like. It will be apparent that, if a coupler device is to have a relatively large band width, the selected surface wave medium for the coupler must have a high piezoelectric coupling factor, or else its insertion loss will be undesirably high. A second desirable attribute of the surface wave medium is that it have a characteristic delay that varies little with temperature over the operating temperature range of the apparatus in which the coupler is to be used.

The best known materials because of their ready availability in acceptable substrate size and of useful mechanical properties and the like are $LiNbO_3$ and quartz. A commonly used material, $LiNbO_3$, has a desirably high piezoelectric coupling, but it has a delay variation of 92 parts per million per degree Centigrade temperature variation, which is objectionably large. By contrast, quartz, particularly ST-cut quartz, as a second generally available material, has a fairly wide normally useful temperature range wherein there is substantially zero delay variation with temperature. However, the piezoelectric coupling constant of ST-cut quartz is distinctly lower than that of $LiNbO_3$. Thus, ST-cut quartz devices can operate only over a relative band width of four percent with minimal insertion loss, while a $LiNbO_3$ device can operate over a 25 percent relative band width with the same insertion losses.

SUMMARY OF THE INVENTION

Preferred forms of the invention are represented by surface acoustic wave directional coupling devices having predetermined coupling characteristics. According to the invention, means are provided whereby electrical input signals generate propagating surface waves on a surface of a first substrate having a high piezoelectric coupling coefficient and whose delay is temperature dependent and then energy is progressively transferred from that first propagation track to a second energy propagating track cooperating with a substrate having a low piezoelectric coupling coefficient and whose delay and propagation velocity are substantially temperature independent. While the characteristics of the most available materials are thus beneficially utilized, the technique may be in theory employed with any pair of surface wave media, even if they have substantially the same piezoelectric coupling strengths, as long as only one of the media displays an essentially constant propagation velocity and therefore a constant delay over a wide range of temperatures.

DESCRIPTION OF THE PREFERRED EMBODIMENTS

Figure 1:
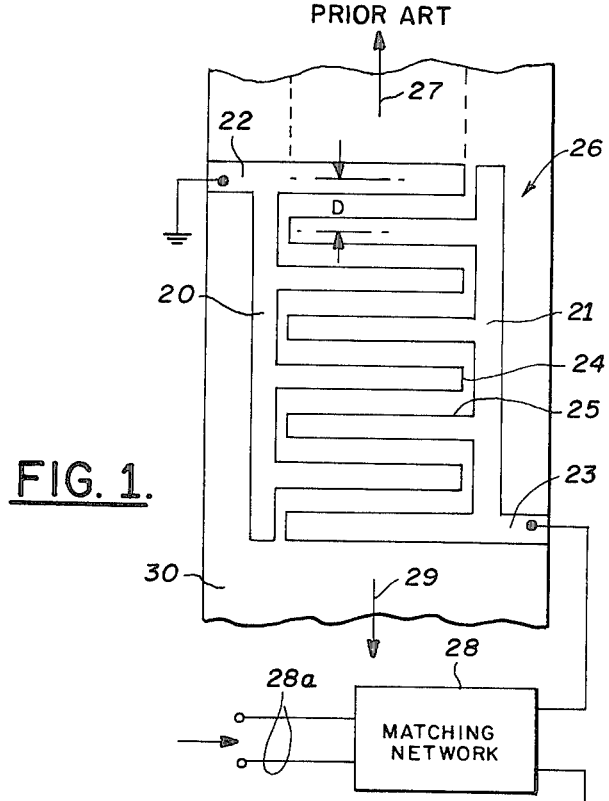
FIG. 1 is a plan view representation of a prior art signal transducer useful in the invention.

A coupling device according to the present invention will employ surface wave exciting or launching and receiving transducer devices kindred to that illustrated in FIG. 1. Removal of the surface acoustical wave or receiving it for generating a new electrical wave will be accomplished by a similar transducer structure, since the reciprocity theorem is in force. While several types of acoustic surface wave exciter and receiver transducers are available in the prior art, a preferred form of the surface wave excitation means will be discussed in connection with FIG. 1. The device 26 consists of a pair of electrodes 20, 21 with respective interdigital electrode fingers of alternating instantaneous electrical polarity, such as the respective fingers 24, 25. Standard photoetching and photoresist masking or other well known techniques may be used to fabricate the thin conductors of the interdigital electrodes 20, 21, which electrodes may be made of aluminum or other electrically conducting material, and may have widths of the order of microns. Adjacent fingers of any one electrode, such as fingers 24 of electrode 20, are spaced substantially one wave length apart at the center of the operating carrier frequency range. The electrode device 20, 21 acts as an end fire array, propagating the desired forward flowing surface acoustic wave in the direction indicated by arrow 27 when driven by signals which may be passed through a conventional matching network 28 from a signal source (not shown) coupled to leads 28a.

Where generation of an undesired reverse wave as indicated by arrow 29 may not be tolerated, this wave energy may be absorbed in a convenient acoustically matched absorber. For example, an end layer of conventional acoustic absorbing material, such as wax or rubber or dielectric tape may be used. Since the recriprocity theorem evidently applies to the exciter of FIG. 1, a similarly constructed electrode system may act as a surface acoustic wave receiver, coupling to the traveling electric field associated with the surface elastic wave, and thereby yielding a useful electrical output for signal processing.

In operation, the exciter electrode system 26 of the transducer of FIG. 1, for example, interacts with the piezoelectric LiNbO$_3$ or other substrate 30, producing the two oppositely running surface acoustic waves 27, 29 flowing at right angles to the electrode fingers 24, 25. Adjacent fingers of electrodes 20, 21 are preferably spaced apart by an integral number of half wave lengths. The traveling wave is successively increased in amplitude as it passes under each pair of electrode fingers. A receiver electrode system is similarly constituted and operates in the reverse sense to reconvert the acoustic wave into a delayed electrical output signal. In both cases, it is preferred in the interest of efficiency to space the electrode fingers so that the condition of acoustic synchronism obtains, the traveling electric field at the exciter, for example, having the same periodicity as the electric field normally bound to the acoustic wave. For this condition, D in FIG. 1 is one half wave length. It will further be understood by those skilled in the art that other known, but more complex, sonic wave launcher and receiver devices may be substituted for the typical device 26 of FIG. 1 so that substantially all energy is propagated only in the useful direction 27.

Figure 2:
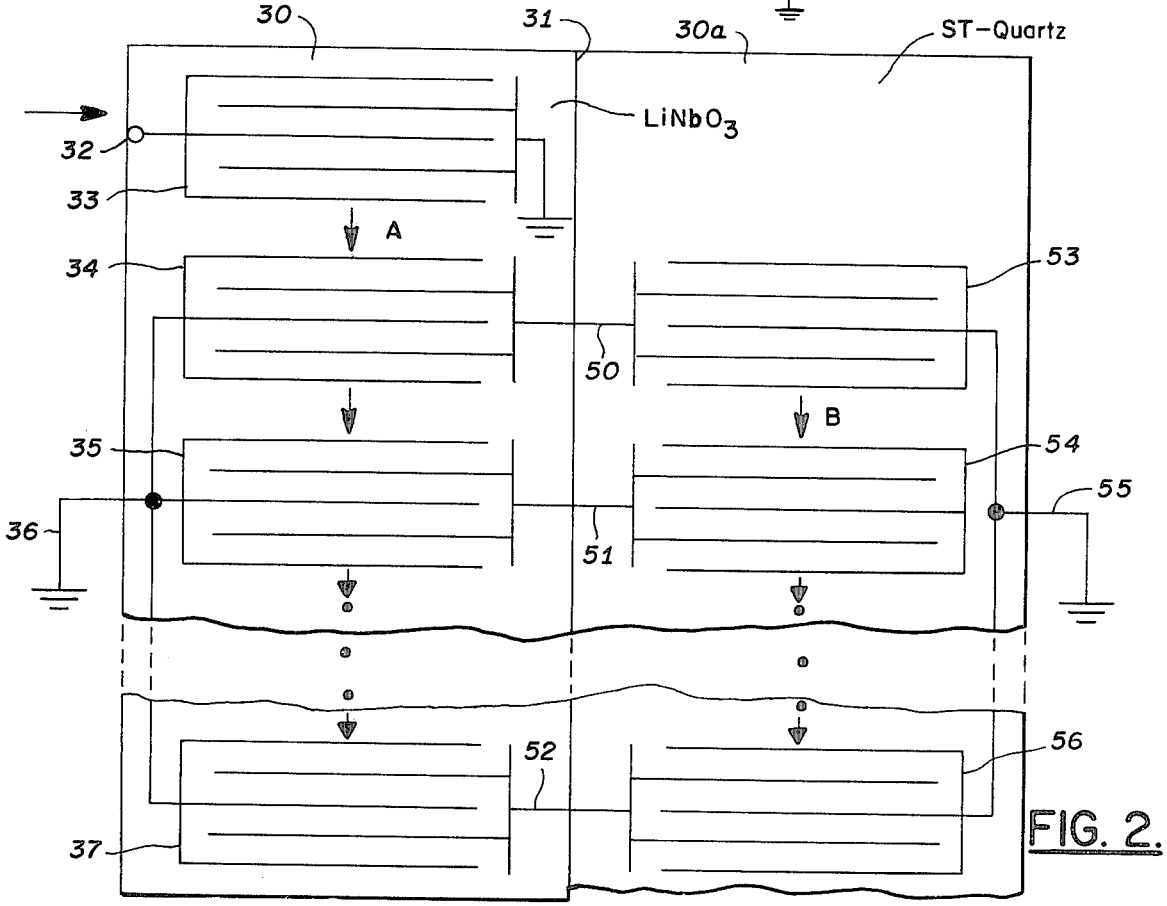
FIG. 2 is a plan view of a first form of the invention.

In the embodiment of FIG. 2, there is illustrated a form of the invention having an electrical input at terminal 32 and a delayed acoustical output at transducer 56. Acoustical surface wave tracks A and B, generally parallel one to the other, are formed on the respective surfaces of two piezoelectric media. In the structure represented in FIG. 2, a LiNbO$_3$ medium 30 is associated with track A along with an input transducer 33 generally similar to device 26 of FIG. 1. One electrode of input transducer 33 is coupled to the electrical input terminal 32, while the interleaved electrode is grounded. An ST-cut alpha quartz substrate 30a is associated with track B.

Track A includes a plurality of sub-transducers such as sub-transducers 34, 35, . . . 37, for forming an array of equally-spaced devices for coupling energy in electrical form out of the surface wave of track A. These signals are coupled from the respective sub-transducers 34, 35, . . . , 37 via conducting leads 50, 51, . . . , 52 across the interface junction 31 between substrates 30, 30a into track B. Track B includes a plurality of similar sub-transducers 53, 54 . . . , 56. As in FIG. 4, substrates 30, 30a may be supported upon a base plate 101 which may be constructed of an inexpensive plastic or similar light weight material for mechanically locating substrates 30, 30a in fixed abutting relation. If electrical shielding is desired, substrate 101 may be a metal sheet. Thus, conductors 50, 51, . . . , 52 may readily be disposed to cross over junction 31 in permanent relation thereto.

A surface wave is launched in the LiNbO$_3$ material of track A of FIG. 2 in the direction of the arrows by input transducer 33, using the successive sub-transducers 34, 35, . . . , 37 as delay line taps for the respective conductors 50, 51, . . . , 52. From leads 50, 51, . . . , 52, the electrical energy is transferred to the surface wave in the quartz medium of the adjacent track B via the sub-transducer array 53, 54, . . . , 56. Generally, the propagation delay of the active LiNbO$_3$ surface track will be much less than the propagation delay of the active quartz surface path, so that the over-all variation in delay due to temperature changes will be minimal. As noted, each sub-transducer of propagation track A is connected by a small conducting wire to a sub-transducer of track B. In order efficiently to couple energy from track A of substrate 30 to track B of substrate 30a for forming a surface acoustic wave flowing in the direction of the arrows in track B, the phase difference between any two sub-transducers on the LiNbO$_3$ substrate 30, such as sub-transducers 34, 35, will preferably be the same as that between a corresponding pair of sub-transducers at the quartz surface, such as between sub-transducers 53, 54. In other words, the physical distances between centers of the sub-transducers on the quartz track B will preferably be reduced with respect to the distances between centers of the sub-transducers at the LiNbO$_3$ path by the ratio of the acoustic propagation velocity in LiNbO$_3$ to that in quartz, for example. The fact that the connecting wires 50, 51, . . . , 52 will not necessarily be parallel is of no major consequence. The widths of the acoustic tracks do not need to be the same, but may actually differ or be varied along their lengths so as to optimize coupling between the two acoustic tracks, if desired.

Further considerations involve the separation of the sub-transducers. It is desirable to place the respective sub-transducers of each array as close together as possible, since this minimizes the total delay of path A on the LiNbO$_3$. The number of inter-digital electrode fingers for each sub-transducer may be different for the two acoustical paths. If more interdigital or interleaved fingers are used in the electrodes at the quartz surface to compensate for its lower piezoelectric coupling coefficient, there must be enough blank spaces between the sub-transducers at the LiNbO$_3$ so that the phase delays between centers of adjacent corresponding sub-transducers are the same for both acoustical paths.

As is very generally true of wave propagation directional coupling devices, if an insufficient number of sub-transducers is used, only part of the surface wave of energy track A will be transferred to track B, inducing additional insertion loss. If too many sub-transducers are used, the energy will be transferred from track A to track B and then at least partially back into track A, again inducing extra insertion loss. It is possible to place small series or parallel connected tuning inductors with respect to the connectors 50, 51, . . . , 52 and to adjust them to increase the coupling between the respective surface waves of the substrate tracks A and B and thus to decrease the total number of sub-transducers that would otherwise be required to transfer all of the energy of track A into track B. This feature beneficially reduces the track A length on the temperature dependent LiNbO$_3$ substrate. It is desirable, furthermore, to have the spacing between sub-transducers equal to (N+m) $\lambda$ for both arrays, where N is a selected integer, m is a true fraction, and $\lambda$ is the center operating wave length. The quantity m may not be zero or 0.5, because then the array on quartz does not couple to a surface wave in only one direction at the LiNbO$_3$ surface, and vice versa. But with m not zero and not 0.5, an acoustic wave propagating at the LiNbO$_3$ surface in one direction will desirably couple only to the acoustic wave on the quartz surface traveling in that same direction.

The band width of the device illustrated in FIG. 2 is determined by the total number of interleaved or interdigital electrode figures of the input transducer 33 at LiNbO$_3$ track A and in each sub-transducer 34, 35, . . . , 37, being inversely proportional to that total number, and not on the number of sub-transducers. Accordingly, it is possible to have a large number of interleaved electrode fingers on the second or quartz substrate 30a while still maintaining a large band width, as long as the number of interleaved electrode fingers per transducer is small. Wide band operation may be achieved by limiting the number of interdigital fingers per transducer, while using a greater plurality of sub-transducers to couple energy into the quartz substrate track B in the form of surface acoustic waves. Since the intermediate sub-transducers on the quartz substrate 30a each have a relatively low number of electrode fingers, a wide band width may be achieved. Because a large total number of finger electrodes is used on the quartz substrate, the high insertion loss normally encountered using ST-cut quartz may be compensated. The over-all band width of the novel coupler device will in some cases be determined by one of its elements; the transducer or sub-transducer of track A with the largest number of interleaved or interdigital electrode fingers will generally be the band width limiting element of the assembly. It will be apparent to those skilled in the art that the signals being processed may equally well be an acoustic signal incident upon the quartz transducer array at transducer 56 and flowing out of transducer 30 at terminal 32. In this mode of operation, the novel coupler device is acting as a low loss, wide band output transducer.

Figure 3:
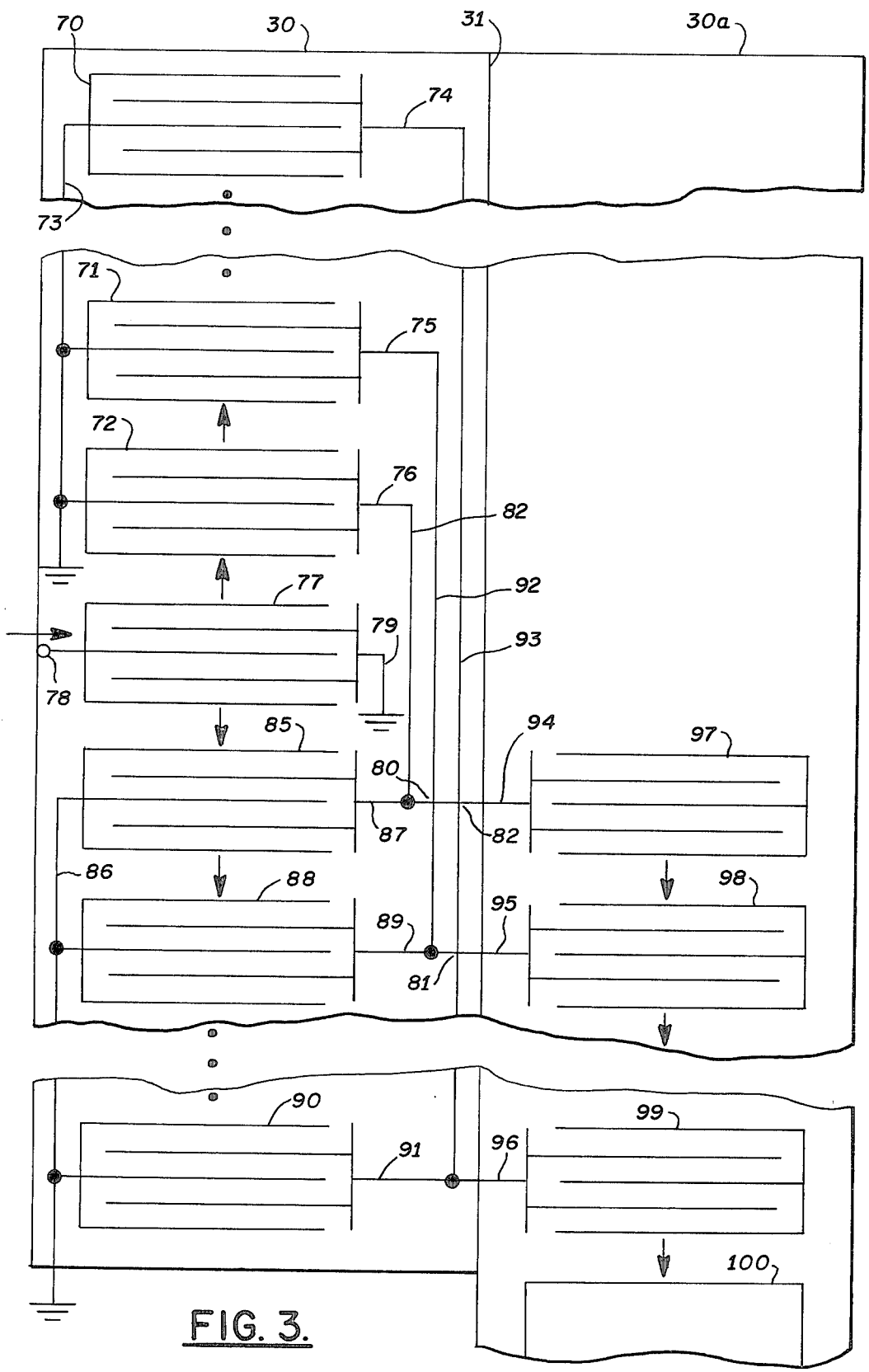
FIG. 3 is a plan view of an improved form of the invention.
Figure 4:
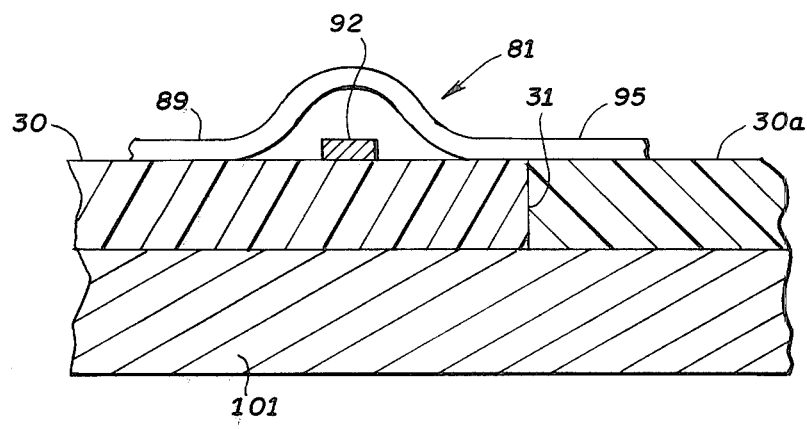
FIG. 4 is a cross section view showing constructional details of the apparatus of FIGS. 3 and 4.

As seen in FIGS. 3 and 4, a further embodiment of the invention in which efficiency is improved is achieved by placing track A sub-transducers on both sides of a centrally-located input transducer 77 fed from the input terminal 78 and grounded at 79. Thus, on one side of transducer 77 is located an array of sub-transducers 72, 71, . . . , 70 and, symmetrically disposed on the other side of transducer 77 is an array of sub-transducers 85, 88, . . . , 90. Any loss from the unused side of input transducer 33 of FIG. 2 is thus avoided in the following manner. Energy picked off the oppositely flowing waves in track A is coupled by sub-transducers 72, 85 over leads 76, 82, and 87 and via lead 94 into sub-transducer 97 of track B. Further energy picked off of the oppositely flowing waves in track A is coupled by sub-transducers 71, 88 over leads 75, 92, and 89 via lead 95 into sub-transducer 98 of track B. Similarly, further energy picked off of the oppositely flowing waves in track A is coupled by sub-transducers 70, 90 over leads 74, 93, and 91, flowing via lead 96 into sub-transducer 99 of track B. As in FIG. 1, the sub-transducers 97, 98, . . . , 99 are so disposed that energy is added at each sub-transducer to the wave originating in transducer 97 and flowing in the sense of the arrows in track B, as it was in FIG. 2. Conventional apparatus 100 for making direct use of the delayed acoustic wave may be situated directly on the substrate 30a. It will be apparent to those skilled in the art that the input signal to be processed may equally well flow into sub-transducer 99 and out of terminal 78.

Accordingly, it is seen that preferred forms of the invention provide passive surface acoustic wave directional coupling devices having, along with desirably selectable coupling characteristics, minimal variation in their delay characteristics over a large operating temperature range and representing high efficiency, wide band, signal processing devices permitting reciprocal propagation therethrough.

While the invention has been described in its preferred embodiments, it is understood that the words which have been used are words of description rather than of limitation and that changes within the purview of the appended claims may be made without departure from the true scope and spirit of the invention in its broader aspects.

What is claimed is:

1. Signal processing apparatus comprising:
first transmission line means having input means and a first plurality of tap means and characterized by a propagation velocity therethrough significantly dependent upon temperature over a range of operating temperatures,
second transmission line means having output means and a second plurality of spaced tap means and characterized by a propagation velocity therethrough substantially independent of temperature over said range of operating temperatures, and
a plurality of electrical conductor means for coupling respective ones of said first plurality of spaced tap means to corresponding ones of said second plurality of spaced tap means,
said signal processing apparatus being characterized by a resultant propagation time from said input means to said output means substantially independent of temperature over said range of operating temperatures.

2. Apparatus as described in claim 1 wherein:
said first transmission line means comprises first acoustic surface wave transmission line means employing a first substrate of a first piezoelectric material,
said second transmission line means comprises second acoustic surface wave transmission line means employing a second substrate of a second piezoelectric material,
said first plurality of tap means comprises plural interdigital electrode tap means disposed at a surface of said first substrate, and
said second plurality of tap means comprises plural interdigital electrode means disposed at a surface of said second substrate.

3. Apparatus as described in claim 2 wherein:
said first substrate material has a first piezoelectric coupling coefficient, and
said second substrate material has a second piezoelectric coupling coefficient substantially lower than said first piezoelectric coupling coefficient.

4. Apparatus as described in claim 3 wherein:
said first substrate material is $LiNbO_3$, and said second substrate material is quartz.

5. Signal processing apparatus comprising:
first substrate means for propagating a first acoustic wave having a first velocity characteristic at a surface thereof,
first transducer means for launching an acoustic wave along a first propagation track at said first substrate surface in a predetermined direction,
second substrate means for propagating a second acoustic wave having a second velocity characteristic at a surface thereof,
second transducer means for converting into an electrical output an acoustic wave propagating along a second propagation track at said second surface substrate,
said first and second substrate means being disposed in generally coplanar side-by-side relation,
a first array of interdigital electrode tap means disposed at said first substrate surface, each disposed across said first propagation track,
a second array of interdigital electrode tap means disposed at said second substrate surface, each disposed across said second propagation track, and an array of electrical conductors connecting corresponding ones of said first array of interdigital electrode tap means to respective ones of said second array of interdigital electrode tap means, said signal processing apparatus being characterized by a resultant propagation time through said first array, said array of electrical conductors, and said third array substantially independent of temperature over a range of operating temperatures.

6. Apparatus as described in claim 5 wherein:

said first velocity characteristic is representative of a propagation velocity of said first substrate surface wave significantly dependent upon temperature over a range of operating temperatures, and said second velocity characteristic is representative of a propagation velocity of said second substrate surface wave substantially independent over said range of operating temperatures.

7. Apparatus as described in claim 6 wherein said first substrate means has a surface acoustic wave piezoelectric coupling coefficient substantially greater than the surface acoustic wave piezoelectric coupling coefficient of said second substrate means.

* * * * *